United States Patent
Kwon et al.

(10) Patent No.: US 6,635,539 B2
(45) Date of Patent: Oct. 21, 2003

(54) METHOD FOR FABRICATING A MOS TRANSISTOR USING A SELF-ALIGNED SILICIDE TECHNIQUE

(75) Inventors: Hyung-Shin Kwon, Kyunggi-do (KR); Do-Hyung Kim, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/131,418

(22) Filed: Apr. 22, 2002

(65) Prior Publication Data

US 2002/0197805 A1 Dec. 26, 2002

(30) Foreign Application Priority Data

Apr. 30, 2001 (KR) ......................... 2001-23446

(51) Int. Cl.$^7$ ................... H01L 21/336; H01L 21/3205; H01L 21/4763
(52) U.S. Cl. ................. 438/301; 438/303; 438/592; 438/595
(58) Field of Search ................. 438/301, 303, 438/307, 586, 592, 595, 652, 769, 770

(56) References Cited

U.S. PATENT DOCUMENTS

| | | | |
|---|---|---|---|
| 5,846,887 A | * 12/1998 | Lee et al. | ................... 438/769 |
| 6,121,092 A | * 9/2000 | Liu et al. | ................... 438/281 |
| 6,171,942 B1 | * 1/2001 | Lee et al. | ................... 438/596 |
| 6,326,669 B1 | * 12/2001 | Hwang et al. | ............... 438/592 |
| 6,376,320 B1 | * 4/2002 | Yu | ............... 438/303 |

* cited by examiner

Primary Examiner—John F. Niebling
Assistant Examiner—Walter L. Lindsay, Jr.
(74) Attorney, Agent, or Firm—Marger Johnson & McCollom, P.C.

(57) ABSTRACT

A method for fabricating a MOS transistor using a self-aligned silicide technique is provided. The method includes forming a gate electrode and a silicidation resistant layer pattern that are sequentially stacked on a predetermined region of a semiconductor substrate. Impurities are implanted into the semiconductor substrate to form a source/drain region. A first metal silicide layer is selectively formed on the surface of the source/drain region. The silicidation resistant layer pattern is then removed to expose the gate electrode. A second metal silicide layer is selectively formed on the exposed gate electrode. Consequently, the first metal silicide layer can be formed of a metal silicide layer having superior tolerance with respect to junction spiking. Also, the second metal silicide layer can be formed of another metal silicide layer having a low variation of resistivity due to the variation of the line width of the gate electrode. Therefore, it is possible to fabricate a high-performance MOS transistor suitable for a highly integrated semiconductor device.

16 Claims, 8 Drawing Sheets

US 6,635,539 B2

METHOD FOR FABRICATING A MOS TRANSISTOR USING A SELF-ALIGNED SILICIDE TECHNIQUE

RELATED APPLICATION

This application claims priority from Korean Patent Application No. 2001-23446, filed on Apr. 30, 2001, the contents of which are incorporated herein by reference in their entirety.

FIELD OF THE INVENTION

The present invention relates to a method for fabricating a semiconductor device and, more particularly, to a method for fabricating a MOS transistor using a self-aligned silicide technique.

BACKGROUND OF THE INVENTION

As semiconductor devices become more highly integrated, the line width of a gate electrode and the depth of source/drain regions in a MOS transistor have been reduced. Thus, the operating speed of the MOS transistor becomes slower, since resistances of both the gate electrode and the source/drain regions increase. Also, if the depths of the source/drain regions become shallower, the semiconductor substrate under the source/drain regions may be exposed due to over-etching during the formation of contact holes to expose the source/drain regions. Further, when a metal layer is formed in the contact holes that expose the shallow source/drain regions, a junction-spiking phenomenon more easily occur, where the metal layer penetrates the source/drain regions. Accordingly, a salicide technique is widely used in semiconductor fabrication processes. According to the salicide technique, a metal silicide layer is selectively formed on the gate electrode and the source/drain regions.

The metal silicide layer can be classified into three categories. One is a refractory metal silicide layer, another is a group-VIII metal silicide layer and the other is a titanium silicide layer. Here, the refractory metal silicide layer exhibits higher resistivity than the group-VIII metal silicide layer and the titanium silicide layer. Thus, it is preferable to use the titanium silicide layer or the group-VIII metal silicide layer in order to reduce the resistances of the gate electrode and the source/drain regions. The group-VIII metal silicide layer comprises a cobalt silicide layer, a platinum silicide layer, a palladium silicide layer and a nickel suicide layer.

However, if the cobalt silicide layer is formed on the source/drain regions, junction leakage current characteristics of the source/drain regions may be degraded. Thus, it is preferable that the cobalt silicide layer be formed only on the gate electrode. In particular, the cobalt silicide layer exhibits less variation in resistivity due to variations of the line width of the cobalt silicide layer than the titanium silicide layer. Therefore, a technique employing the cobalt silicide layer only on the gate electrode is widely used in a highly integrated semiconductor device having a narrow line width.

FIGS. 1 through 5 are cross-sectional views illustrating a conventional method of fabricating a MOS transistor. In each of the drawings, the reference characters "a" and "b" represent a cell array region and a peripheral circuit region, respectively.

Referring to FIG. 1, a device isolation layer 3 is formed in a predetermined region of a semiconductor substrate 1 to define an active region thereof. A gate insulation layer 5 is formed on the active region. A gate electrode layer and a silicidation resistant layer are sequentially formed on the entire surface of the semiconductor substrate having the gate insulation layer 5. The silicidation resistant layer and the gate electrode layer are successively patterned to form a first gate pattern 10a and a second gate pattern 10b in the cell array region "a" and in the peripheral circuit region "b", respectively. Thus, each of the first and second gate patterns 10a and 10b includes a gate electrode 7 and a silicidation resistant layer pattern 9, which are sequentially stacked. The first gate pattern 10a (extends across) the active region in the cell array region "a" and the second gate pattern 10b extends across the active region in the peripheral circuit region "b".

Referring to FIG. 2, an insulation spacer 11 is formed on the sidewalls of the first and second gate patterns 10a and 10b. An etch stop layer 13, e.g., a silicon nitride layer, is then formed on the entire surface of the resulting structure having the spacer 11 formed thereon. An interlayer insulation layer 15 is formed on the etch stop layer 13.

Referring to FIG. 3, the interlayer insulation layer 15 is planarized to expose the etch stop layer 13 on the first and second gate patterns 10a and 10b using chemical mechanical polishing (CMP). At this time, a density of MOS transistors in the peripheral circuit region "b" is lower than that in the cell array region "a". Thus, as shown in FIG. 3, a dishing phenomenon occurs in the peripheral circuit region "b". As a result, a first planarized interlayer insulation layer 15a formed in the cell array region "a" has a uniform thickness, while a second planarized interlayer insulation layer 15b formed in the peripheral circuit region "b" has a non-uniform thickness. That is, a region 17 having a thin planarized interlayer insulation layer can be formed on the active region and the device isolation layer 3 in the peripheral circuit region "b". If the dishing phenomenon occurs severely, the device isolation layer 3 and the active region in the peripheral circuit region "b" may be exposed or severely damaged.

Referring to FIG. 4, the exposed etch stop layer 13 and the silicidation resistant layer patterns 9 thereunder are etched to expose the gate electrodes 7 in the cell array region "a" and the peripheral circuit region "b". A cobalt layer 19 is formed on the entire surface of the resulting structure where the gate electrodes 7 are exposed.

Referring to FIG. 5, a semiconductor substrate having the cobalt layer 19 is annealed to form a cobalt silicide layer 19a on the surfaces of the gate electrodes 7. Then, the unreacted portions of the cobalt layer 19 that remain on the first and second planarized interlayer insulation layers 15a and 15b are selectively removed.

According to the conventional technique described above, a planarization process such as the CMP process is required in order to selectively form the cobalt silicide layer only on the gate electrodes. Thus, severe damage to the active region and the device isolation layer in the peripheral circuit region may result from a dishing phenomenon. Also, because a metal silicide layer such as the cobalt silicide layer is not formed on the source/drain regions of the MOS transistor, it is very difficult to reduce resistivity of the source/drain regions. Further, if shallow source/drain regions are formed, a process margin for the over-etching is decreased during the formation of contact holes to expose the source/drain regions. In other words, if the etching process for forming the contact holes is excessively performed, a junction-spiking phenomenon may occur.

SUMMARY OF THE INVENTION

The present invention provides a method for fabricating a MOS transistor that can selectively form a first metal silicide layer that can reduce junction spiking on the surface of source/drain regions as well as a second metal silicide layer having a low variation of resistivity due to the variation of line width of the gate electrode in accordance with one embodiment of the present invention.

The present invention also provides a method for fabricating a MOS transistor that can selectively form first and second metal silicide layers, which are different from each other, on a gate electrode and source/drain regions, respectively, without using a planarization process in accordance with another embodiment of the present invention.

Preferably, the first metal silicide layer is formed of a material layer that is suitable for preventing junction spiking, and the second metal silicide layer is formed of a material layer that has a lower variation of resistivity than the first metal silicide layer due to the variation of line width of the gate electrode. This method includes forming a gate electrode and a silicidation resistant layer pattern that are sequentially stacked on a predetermined region of a semiconductor substrate. Impurities are implanted into the semiconductor substrate to form source/drain regions. A first metal silicide layer is selectively formed on the surface of the source/drain regions. The silicidation resistant layer pattern is removed to expose the gate electrode. A second metal silicide layer is selectively formed on the surface of the exposed gate electrode.

DESCRIPTION OF THE PREFERRED EMBODIMENT

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the attached figures, the thickness of layers and regions is exaggerated for clarity. Also, when a layer is described as being on another layer or on a substrate, the layer can be formed directly on the other layer or the substrate, or a third layer can be interposed therebetween. The same reference numbers indicate the same or similar components throughout the specification.

FIGS. 6 through 11 are cross-sectional views illustrating a method of fabricating a MOS transistor according to a preferred embodiment of the present invention.

Figure 1:
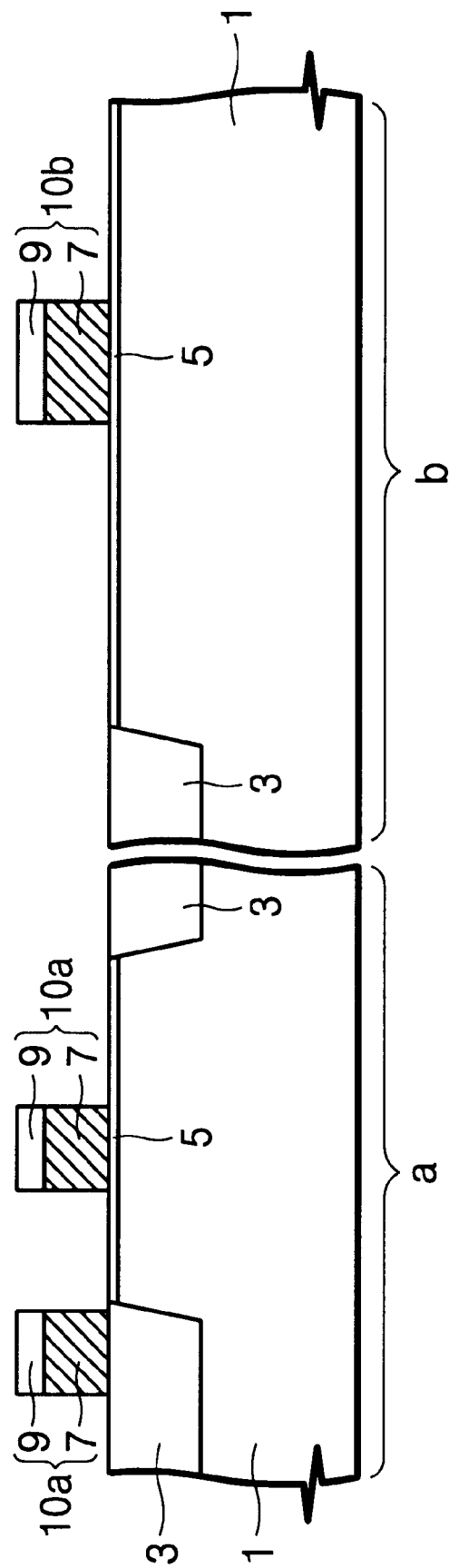
FIGS. 1 through 5 are cross-sectional views for explaining a conventional method of fabricating a MOS transistor.
Figure 2:
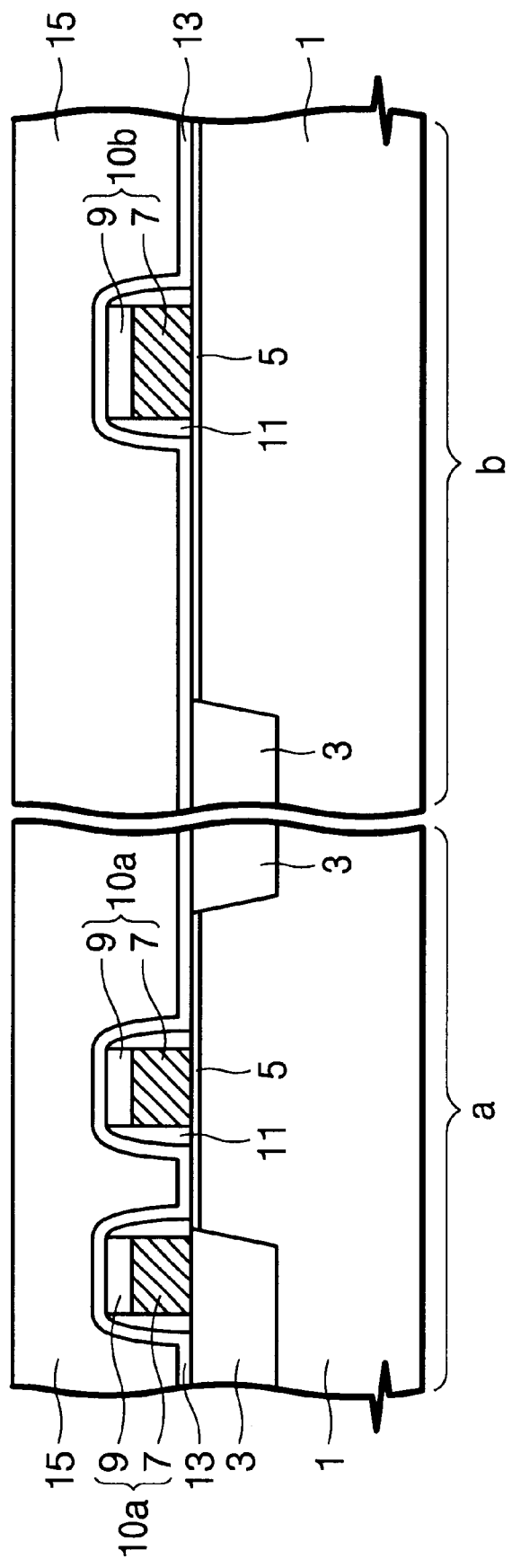
Figure 3:
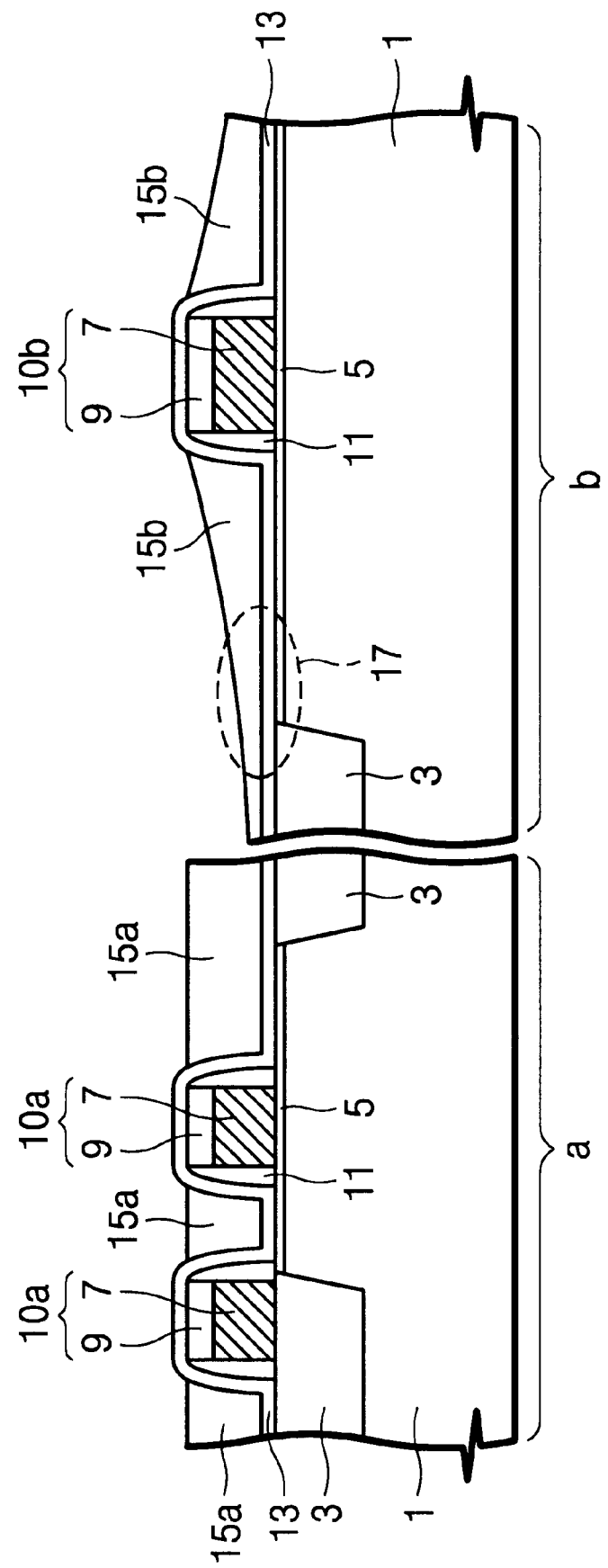
Figure 4:
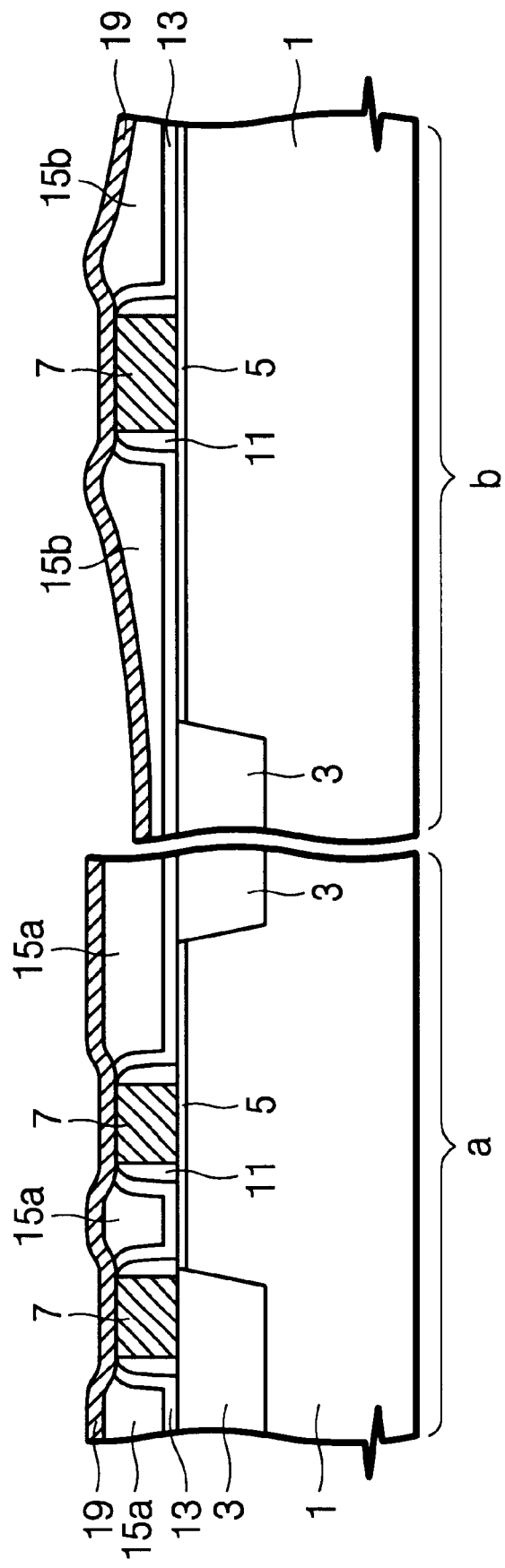
Figure 5:
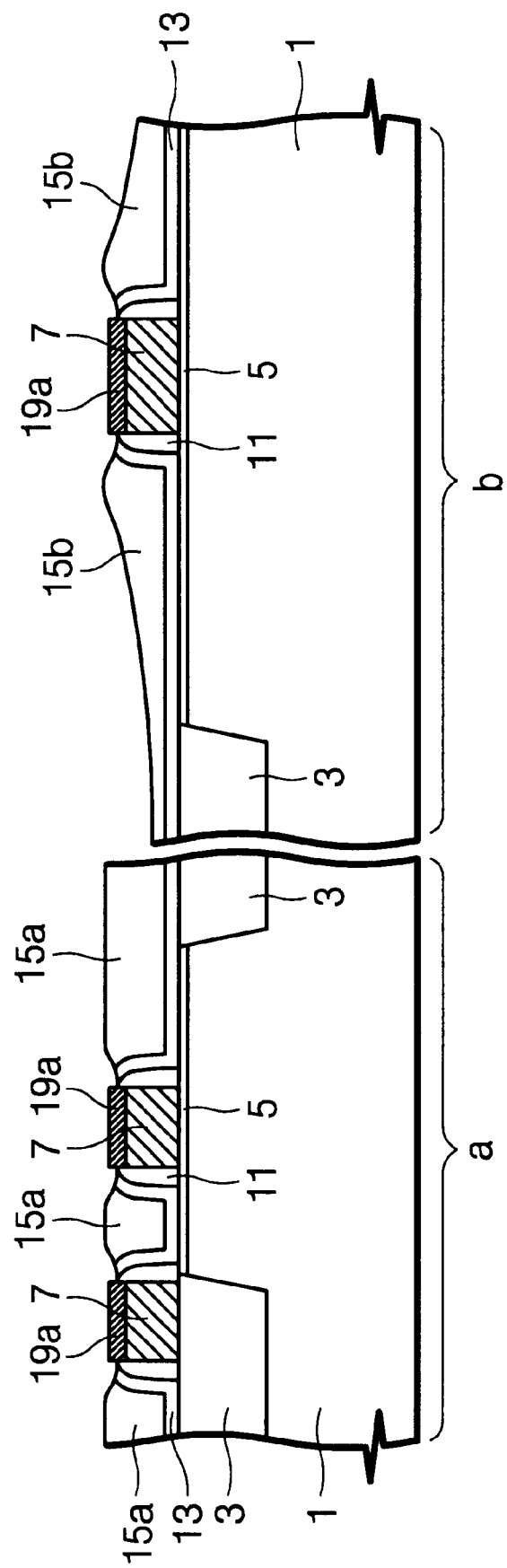
Figure 6:
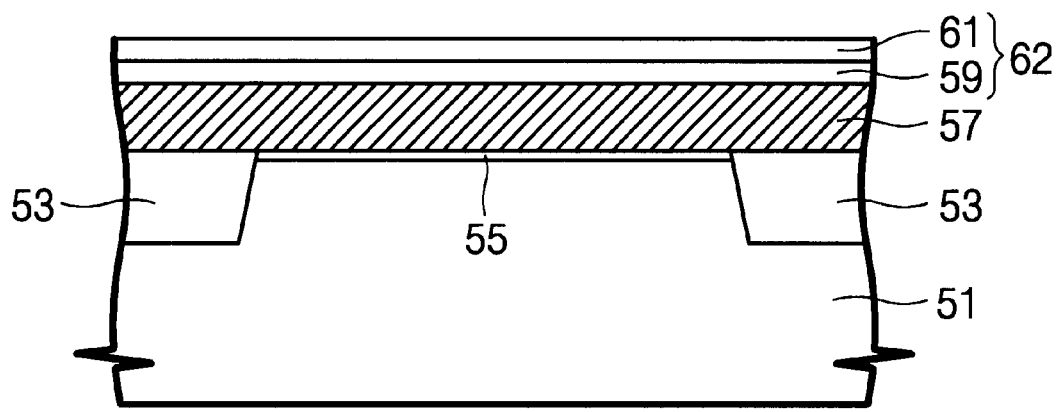
FIGS. 6 through 11 are cross-sectional views for explaining a method of fabricating a MOS transistor according to the present invention.

Referring to FIG. 6, a device isolation layer 53 is formed in a predetermined region of a semiconductor substrate 51 to define an active region thereof. A gate insulation layer 55, such as a thermal oxide layer, is formed on the active region. A gate electrode layer 57 and a silicidation resistant layer 62 are sequentially formed on the resulting structure where the gate insulation layer 55 is formed. The gate electrode layer 57 is preferably a doped polysilicon layer. The silicidation resistant layer 62 is preferably formed by sequentially stacking a capping layer 59 and an anti-reflective layer 61.

The capping layer 59 is preferably a silicon nitride layer or a silicon oxide layer, and the anti-reflective layer 61 is preferably a silicon oxynitride layer. Alternatively, the silicidation resistant layer 62 can be formed of a single layer, for example, the anti-reflective layer 61.

Figure 7:
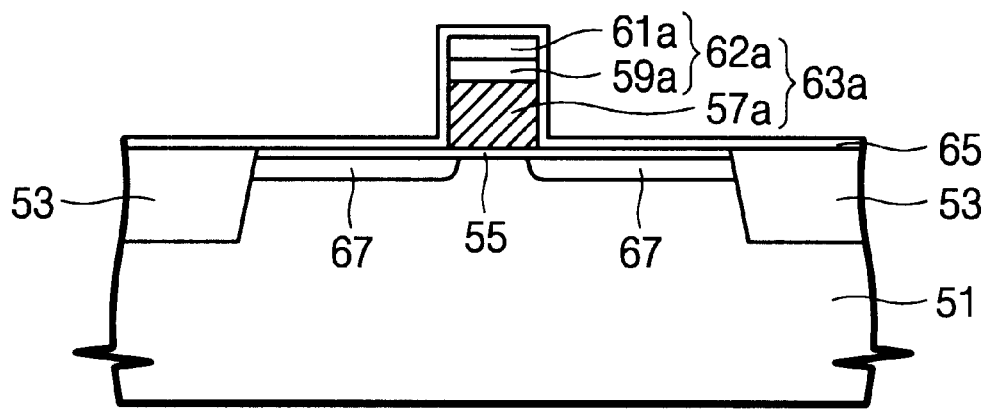

Referring to FIG. 7, the silicidation resistant layer 62 and the gate electrode layer 57 are successively patterned to form a gate pattern 63a that extends across a predetermined region of the gate insulation layer 55. Thus, the gate pattern 63a includes a gate electrode 57a and a silicidation resistant layer pattern 62a, which are sequentially stacked. Also, the silicidation resistant layer pattern 62a may be a double layer including sequentially stacked capping layer pattern 59a and an anti-reflective layer pattern 61a, or it may be a single layer formed by the anti-reflective layer pattern 61a.

A screen oxide layer 65 is conformally formed on the entire surface of the resulting structure where the gate pattern 63a is formed. The screen oxide layer 65 is preferably a medium temperature oxide (MTO) layer. The screen oxide layer 65 is formed to perform a uniform ion implantation process on the active region. Thus, if the thickness of the gate insulation layer 55 that remains on the active region is uniform even after forming the gate pattern 63a, such a process for forming the screen oxide layer 65 can be omitted. Impurities are then implanted into the semiconductor substrate 51 at a low dose of $1 \times 10^{12}$ to $1 \times 10^{14}$ ion atoms/cm$^2$ using the gate pattern 63a and the device isolation layer 53 as ion-implantation masks. As a result, low concentration source/drain regions 67 are formed in the active regions on either side of the gate pattern 63a.

Figure 8:
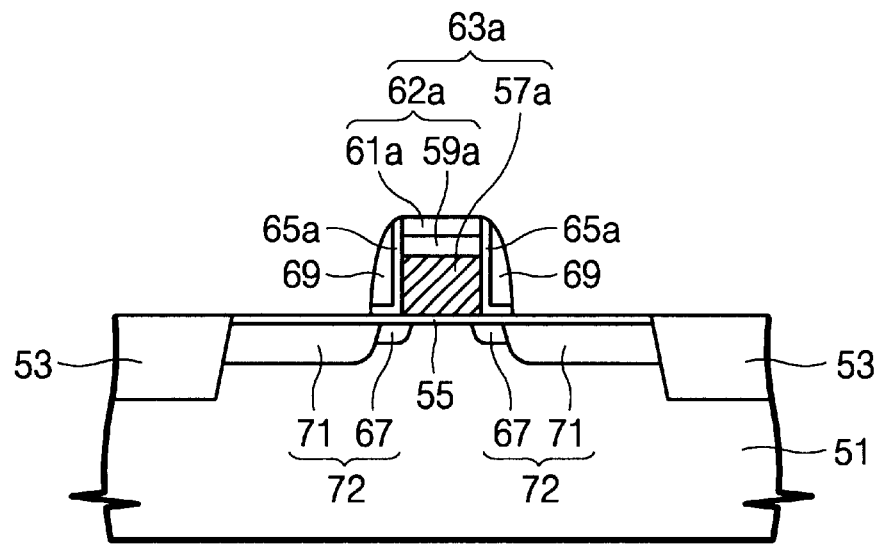

Referring to FIG. 8, a conformal spacer insulation layer is formed on the resulting structure where the low concentration source/drain regions 67 are formed. The spacer insulation layer may be a silicon nitride layer or a silicon oxide layer. The spacer insulation layer and the screen oxide layer 65 are successively and anisotropically etched to form an "L" shaped screen oxide layer pattern 65a and an insulation spacer 69 on the sidewalls of the gate pattern 63a. At this time, the gate insulation layer 55 that remains on the low concentration source/drain regions 67 can be etched.

Subsequently, impurities are implanted into the semiconductor substrate 51 at a high dose of $5 \times 10^{14}$ to $5 \times 10^{15}$ ion atoms/cm$^2$ using the gate pattern 63a, the spacer 69 and the device isolation layer 53 as ion-implantation masks, thereby forming high concentration source/drain regions 71. As a result, the low concentration source/drain regions 67 still exist under the spacer 69. Each of the low concentration source/drain regions 67 and the high concentration source/drain region 71 adjacent thereto constitute lightly-doped drain (LDD) type source/drain regions 72.

Figure 9:
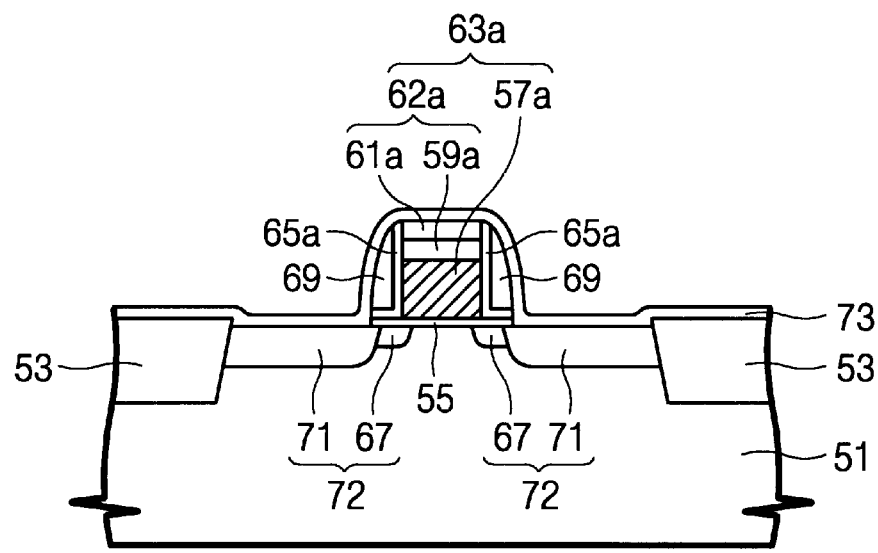

Referring to FIG. 9, the gate insulation layer 55 or a native oxide layer that remains on the high concentration source/drain region 71 is selectively removed using a surface cleaning process. As a result, the high concentration source/drain region 71 is exposed. A first metal layer 73 is formed on the exposed high concentration source/drain region 71. The first metal layer 73 is preferably a titanium layer. As can be seen from the following Table 1, the titanium layer has the least amount of silicon layer consumed during the formation of the silicide layer.

TABLE 1

|  | TiSi2 | CoSi2 | NiSi2 |
|---|---|---|---|
| Thickness of silicon layer consumed during the formation of silicide layer having a thickness of 10Å [nm] | 2.2 | 3.6 | 2.9 |
| Main diffusion factor | Si | Co | Ni |

In other words, the amount of silicon consumed during the formation of a titanium silicide layer is less than that during the formation of a cobalt silicide layer or a nickel silicide layer. Further, silicon atoms are mainly diffused during the formation of the titanium silicide layer, while cobalt atoms and nickel atoms are mainly diffused during the formation of the cobalt silicide layer and the nickel silicide layer respectively. Consequently, if the first metal layer 73 is formed of titanium, a junction spiking phenomenon at the source/drain region 72 can be reduced during the subsequent silicidation and annealing processes.

Figure 10:
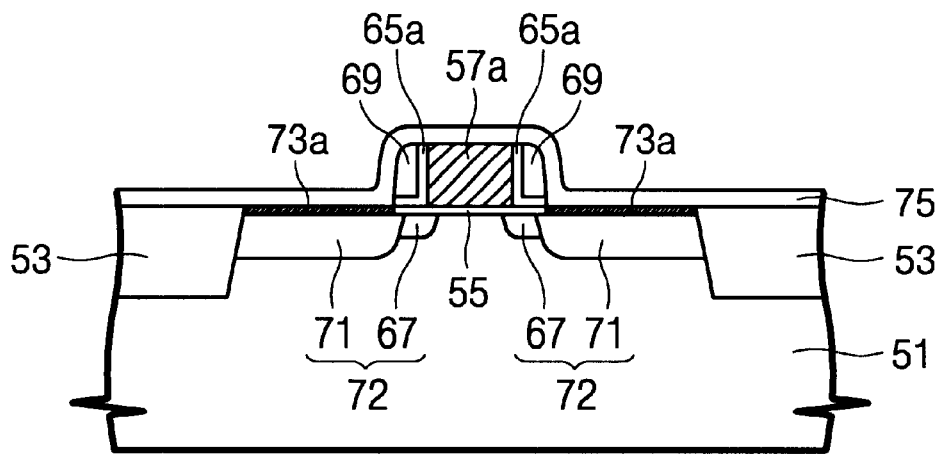

Referring to FIG. 10, the semiconductor substrate 51 having the first metal layer 73 is annealed at a temperature of about 650° C., thereby selectively forming a first metal suicide layer 73a, e.g., a titanium silicide layer on the high concentration source/drain regions 71. The first metal layer 73, that is, unreacted portions of the titanium layer that exists on the spacer 69, the device isolation layer 53 and the silicidation resistant layer pattern 62a is then removed using a chemical solution such as a mixture of de-inonized water, hydroperoxide and ammonium hydroxide. Subsequently, a heat-treatment process is additionally applied to the semiconductor substrate 51 where the unreacted portions of the titanium layer is removed, at a temperature of about 800° C. Thus, sheet resistance of the first metal silicide layer 73a is decreased by the additional heat-treatment. The additional heat-treatment process can be performed in a subsequent annealing process.

Next, the silicidation resistant layer pattern 62a is removed to expose the gate electrode 57a. A second metal layer 75 is formed on the resulting structure where the gate electrode 57a is exposed. It is preferable that the second metal layer 75 be a cobalt layer. This is because the resistance of the cobalt silicide layer exhibits low dependence on the change of its line width. Thus, a cobalt silicide layer is proper as a metal silicide layer formed on the surface of the narrow gate electrode suitable for a highly integrated semiconductor device.

Figure 11:
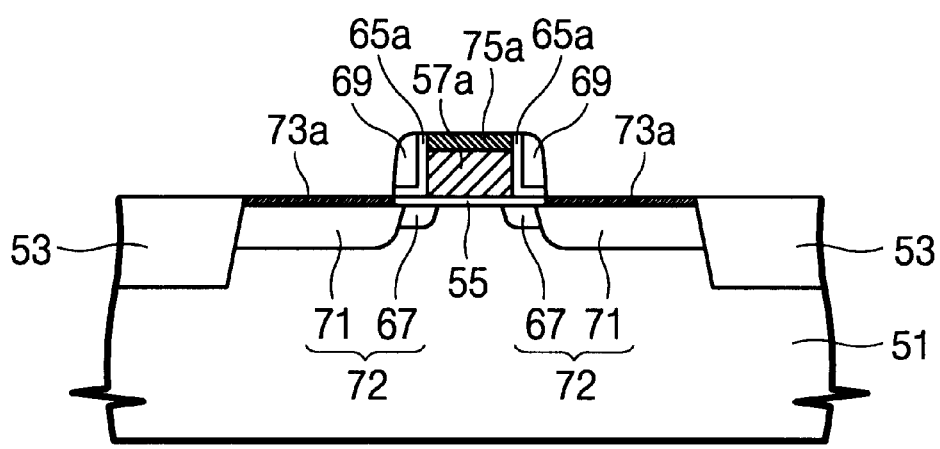

Referring to FIG. 11, the semiconductor substrate 51 having the second metal layer 75 is annealed to form a second metal silicide layer 75a on the surface of the gate electrode 57a. The second metal layer 75 that remains on the spacer 69, the first metal silicide layer 73a and the device isolation layer 53 is then removed.

According to embodiments of the present invention as described above, it is possible to separately form the first and second metal silicide layers on the source/drain regions and the gate electrode without using a planarization process of an interlayer insulation layer. Thus, it is possible to avoid a dishing phenomenon during the planarization process. Also, the etch damage to the source/drain regions in a low-density region can be reduced. Also, the first metal silicide layer may be formed of a material that can prevent junction spiking at the source/drain regions, and the second metal silicide layer can be formed of another material that has a low variation of resistivity due to the variation of line width of the gate electrode. Thus, it is possible to reduce sheet resistance of the source/drain region and a gate electrode as well as to improve junction leakage current characteristics of the source/drain regions. Consequently, it is possible to realize a high performance MOS transistor suitable for a highly integrated semiconductor device having fine width.

In the drawings and specification, there have been disclosed typical preferred embodiments of the invention and, although specific terms are employed, they are used in a generic and descriptive sense only and not for purpose of limitation, the scope of the invention being set forth in the following claims.

What is claimed is:

1. A method for fabricating a MOS transistor comprising:

forming a gate pattern including a gate electrode and a silicidation resistant layer sequentially stacked on a semiconductor substrate;

conformally forming a screen oxide layer over the semiconductor substrate including the gate pattern;

implanting impurities into the semiconductor substrate using the gate pattern as an ion-implantation mask to form a low concentration source/drain region;

forming an insulation spacer on a sidewall of the gate pattern;

implanting impurities into the semiconductor substrate using the gate pattern and the insulation spacer as ion-implantation masks to form a high concentration source/drain region having an impurity concentration that is higher than that of the low concentration source/drain region;

selectively forming a first metal silicide layer on a surface of the high concentration source/drain region;

removing the silicidation resistant layer pattern to expose the gate electrode; and selectively forming a second metal silicide layer on a surface of the exposed gate electrode.

2. The method of claim 1, wherein forming the gate pattern further comprises:

sequentially forming the gate electrode layer and the silicidation resistant layer on the semiconductor substrate; and successively patterning the silicidation resistant layer and the gate electrode layer.

3. The method of claim 2, wherein the silicidation resistant layer is formed by sequentially stacking a capping nitride layer and an anti-reflective layer.

4. The method of claim 2, wherein the silicidation resistant layer is formed by sequentially stacking a capping oxide layer and an anti-reflective layer.

5. The method of claim 2, wherein the silicidation resistant layer is a single layer of an anti-reflective layer.

6. The method of claim 1, wherein the spacer comprises a silicon nitride layer or a silicon oxide layer.

7. The method of claim 1, wherein the screen oxide layer comprises a medium temperature oxide (MTO) layer.

8. The method of claim 2, further comprising cleaning a surface of the semiconductor substrate having the high concentration source/drain region to selectively expose the high concentration source/drain region, prior to formation of the first metal silicide layer.

9. The method of claim 2, wherein forming the first metal silicide layer comprises:

conformally forming a first metal layer on the high concentration source/drain region;

annealing the semiconductor substrate having the first metal layer to selectively form the first metal silicide layer on the surface of the high concentration source/drain region; and selectively removing the first metal layer remaining on the spacer and the silicidation resistant layer pattern.

10. The method of claim 9, wherein the first metal layer comprises a titanium layer.

11. The method of claim 2, wherein the first metal silicide layer comprises a titanium silicide layer.

12. The method of claim 2, wherein forming the second metal silicide layer comprises:

forming a second metal layer on the exposed gate electrode;

annealing the semiconductor substrate having the second metal layer to selectively form the second metal silicide layer on the surface of the gate electrode; and removing the second metal layer remaining on the spacer and the first metal silicide layer.

13. The method of claim 12, wherein the second metal layer comprises a cobalt layer.

14. The method of claim 2, wherein the second metal silicide layer comprises a cobalt silicide layer.

15. A method for fabricating a transistor, the method comprising:

forming a gate pattern having a gate electrode and a silicidation resistant layer sequentially stacked on a semiconductor substrate, the gate pattern having a source/drain region formed adjacent thereto;

selectively forming a first metal silicide layer on the source/drain region;

removing the silicidation resistant layer pattern to expose the gate electrode;

forming a metal layer on the exposed gate electrode and directly on the first metal silicide layer;

annealing the metal layer to form a second metal suicide layer on the exposed gate electrode; and removing the metal layer that remains on the first metal silicide layer.

16. The method of claim 15, wherein the metal layer is a cobalt layer.

* * * * *

UNITED STATES PATENT AND TRADEMARK OFFICE
CERTIFICATE OF CORRECTION

PATENT NO. : 6,635,539 B2
DATED : October 21, 2003
INVENTOR(S) : Kwon et al.

It is certified that error appears in the above-identified patent and that said Letters Patent is hereby corrected as shown below:

Column 1,
Line 48, "nickel suicide layer." should read -- nickel silicide layer. --.

Column 5,
Line 26, "metal suicide layer" should read -- metal silicide layer --.

Column 8,
Line 16, "metal suicide layer" should read -- metal silicide layer --.

Signed and Sealed this

Twenty-ninth Day of June, 2004

JON W. DUDAS
*Acting Director of the United States Patent and Trademark Office*